United States Patent
Chuang et al.

(10) Patent No.: US 6,967,403 B2
(45) Date of Patent: Nov. 22, 2005

(54) PACKAGE STRUCTURE WITH A HEAT SPREADER AND MANUFACTURING METHOD THEREOF

(75) Inventors: Chi-Ta Chuang, Kaohsiung (TW); Chih-Min Pao, Ciaotou (TW); Chien Liu, Kaohsiung (TW); Chi-Hao Chiu, Pingtung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/872,190

(22) Filed: Jun. 18, 2004

(65) Prior Publication Data

US 2004/0256643 A1 Dec. 23, 2004

(30) Foreign Application Priority Data

Jun. 18, 2003 (TW) .............................. 92116590 A

(51) Int. Cl.⁷ ............................................. H01L 23/34
(52) U.S. Cl. ...................................... 257/717; 438/122
(58) Field of Search ............................... 257/704, 706, 257/717, 718, 720, 796; 438/122

(56) References Cited

U.S. PATENT DOCUMENTS

| | | | |
|---|---|---|---|
| 6,472,743 B2 * | 10/2002 | Huang et al. | 257/717 |
| 6,538,319 B2 * | 3/2003 | Terui | 257/704 |
| 6,740,959 B2 * | 5/2004 | Alcoe et al. | 257/659 |

* cited by examiner

*Primary Examiner*—David Nelms
*Assistant Examiner*—Quoc Hoang
(74) *Attorney, Agent, or Firm*—Thomas, Kayden, Horstemeyer & Risley

(57) ABSTRACT

A package structure with a heat spreader and manufacturing method thereof is disclosed. The package structure includes a substrate, a ground pad, a heat spreader, a non-conductive adhesive layer, and a pre-solder layer. A die is seated on the substrate, and the ground pad is disposed on the surface of the substrate. The manufacturing method of the package structure includes the following steps: (a) providing the substrate; (b) forming the pre-solder layer on the ground pad by solder paste printing; (c) forming the non-conductive adhesive layer on the substrate surface for being adjacent to the pre-solder layer by adhesive dispensing; (d) disposing the heat spreader onto the non-conductive layer and the pre-solder layer; and (e) heating the non-conductive adhesive layer for solidification and continuing to heat the pre-solder layer for solder reflow so that the heat spreader is adhered to the substrate via the non-conductive adhesive layer and coupled to the ground pad via the pre-solder layer.

14 Claims, 6 Drawing Sheets

PACKAGE STRUCTURE WITH A HEAT SPREADER AND MANUFACTURING METHOD THEREOF

This application claims the benefit of Taiwan application No. 092116590, filed Jun. 18, 2003, the subject matter of which is incorporated herein by reference.

BACKGROUND OF THE INVENTION

1. Field of the Invention

The invention relates in general to a package structure, and more particularly to a package structure with a heat spreader.

2. Description of the Related Art

As integrated circuit technology changes with each passing day, chips are progressing toward having a high density and a large number of devices. However, a large quantity of heat is generated from the chip in operation. Therefore, a heat spreader is needed to be disposed in the chip in order to release the generated large amount of heat, and thus avoid that the chip is burned down, the circuits have error operation, and the life period of the chip is reduced due to the over-high temperature.

Referring to FIG. 1, a vertical diagram of the substrate without a heat spreader is shown. The substrate 12 has a substrate surface 12a. The ground pad 16 is disposed on the substrate surface 12a, and a die 14 is seated on the substrate 12. Referring to FIG. 2, a vertical diagram of the package structure 10 formed by adhering a heat spreader 20 to the substrate 12 in FIG. 1 is shown. Conventionally, the heat spreader 20 is adhered to the substrate surface 12a by conductive paste. The manufacturing method is performed according to the following steps. First, the conductive paste is formed on the substrate surface 12a and ground pad 16 by adhesive dispensing, and the heat spreader 20 is disposed at a location having the conductive paste on the substrate surface 12a. Afterwards, the heat spreader is adhered to the substrate surface 12a in the paste solidification process, so that the heat spreader 20 can be coupled to the substrate 12 and the ground pad 16. Meanwhile, the heat spreader 20 can be coupled to the ground pad to ground via the conductive paste.

However, when the conductive paste is used to adhere the heat spreader to the substrate surface 12a, the circuit shortcut is resulted very often. Referring to FIG. 3, a cross-sectional view of the conventional package structure along the section line 3—3 in the neighborhood of the ground pad in FIG. 2 is shown. As illustrated in FIG. 3, the substrate 12 has four layers, and substrate solder masks 122 cover the upper and lower surfaces of the substrate 12, excluding the ground pad 16, in order to protect the circuits on the substrate surface 12a. The central layer of the substrate 12 includes a ground layer 18 and a power layer 17. The exposed ground pad 16 contracts with the conductive paste 30 so that the upper surface of the ground pad 16 can be electrically coupled to the heat spreader 20 via the conductive paste 30, and the lower surface of the ground pad 16 can be electrically coupled to the ground layer 18 through the via 182. However, since the heat spreader 20 is coupled to the ground pad 16 by using the conductive paste 30, if some openings 126, such as cracks or crevices, are formed on the substrate solder mask as in the manufacturing process, the circuits on the substrate 12 will have a shortcut to the heat spreader 20 via the conductive paste 30, thereby causing error operations of the die 14.

Conventionally, the heat spreader 20 can also be adhered to the substrate surface 12a by using non-conductive paste. Although, the circuit shortcut issue mentioned above can be solved by this method, however, as the non-conductive paste couples the heat spreader 20 to the ground pad 16, the heat spreader 20 cannot be set to ground via the ground pad 16 due to the non-conductivity of the non-conductive paste. Since the heat spreader is not grounded, its resistance to the electromagnetic interference will be reduced, thereby also easily causing error operations of the die 14.

SUMMARY OF THE INVENTION

It is therefore an object of the invention to provide a package structure with a heat spreader and manufacturing method thereof. The heat spreader is electrically coupled to the ground layer via a pre-solder layer and is adhered to the substrate via non-conductive paste. Therefore, in the package structure of the invention, the heat spreader will not have a shortcut to the substrate as in the prior art.

The invention achieves the above-identified object by providing a package structure with a heat spreader. The package structure includes a substrate, a ground pad, a heat spreader, a non-conductive adhesive layer, and a pre-solder layer. The substrate has a substrate surface, and a die is seated on the substrate. The ground pad is disposed on the substrate surface. The heat spreader has a first connecting part and a second connecting part. The pre-solder layer is formed on the ground pad, for electrically coupling the second connecting part of the heat spreader to the ground pad. The non-conductive adhesive layer is formed on the substrate surface and adjacent to the pre-solder layer, for adhering the first connecting part of the heat spreader to the substrate surface.

The invention achieves the above-identified object by providing a manufacturing method of a package structure with a heat spreader. The method includes the steps of: (a) providing a substrate, wherein at least a ground pad is disposed on a substrate surface of the substrate, and a die is seated on the substrate; (b) forming a pre-solder layer on the ground pad by solder paste printing; (c) forming a non-conductive adhesive layer on the substrate surface for being adjacent to the pre-solder layer by adhesive dispensing; (d) disposing a heat spreader onto the substrate via the non-conductive adhesive layer and the pre-solder layer; and (e) heating the non-conductive adhesive layer for solidification, and continuing to heat the pre-solder layer for solder reflow, so that the heat spreader is adhered to the substrate via the non-conductive adhesive layer and electrically coupled to the ground pad via the pre-solder layer.

Other objects, features, and advantages of the invention will become apparent from the following detailed description of the preferred but non-limiting embodiments. The following description is made with reference to the accompanying drawings.

DETAILED DESCRIPTION OF THE INVENTION

In the package structure of the invention, the heat spreader is respectively coupled to the ground pad and the substrate via the pre-solder layer and the non-conductive paste, instead of the conventional method by which only conducting or non-conductive paste is used to adhere the heat spreader to the substrate surface.

Figure 1:
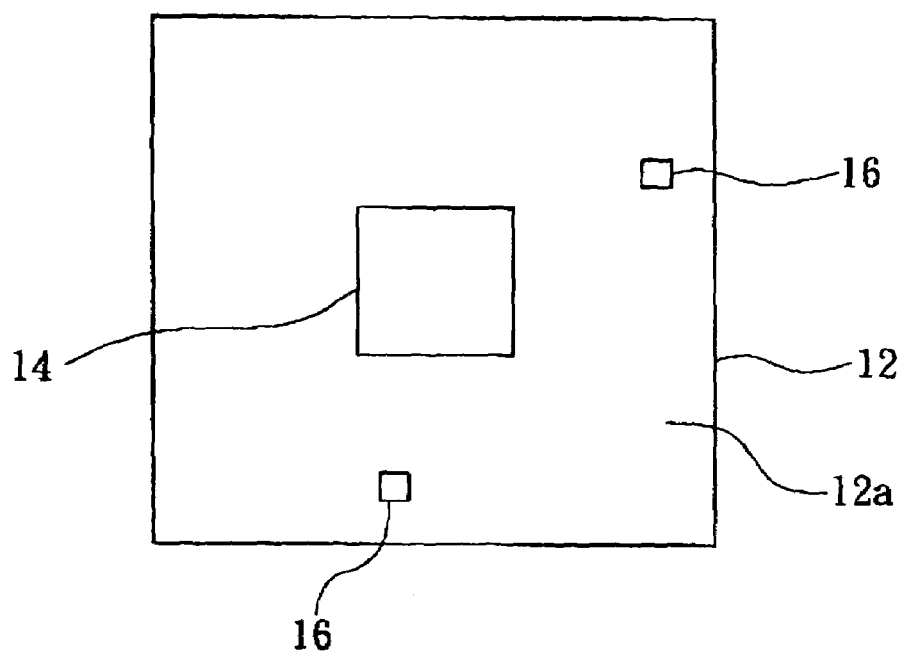
FIG. 1 is a vertical diagram of the substrate without a heat spreader.
Figure 2:
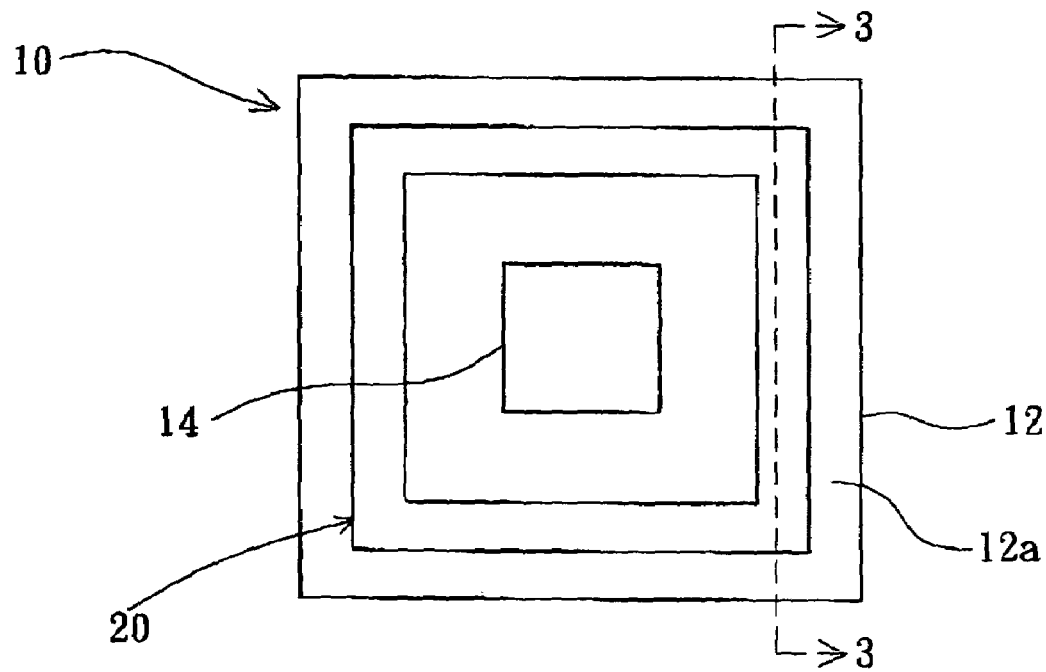
FIG. 2 is a vertical diagram of the package structure formed by adhering a heat spreader to the substrate in FIG. 1.
Figure 3:
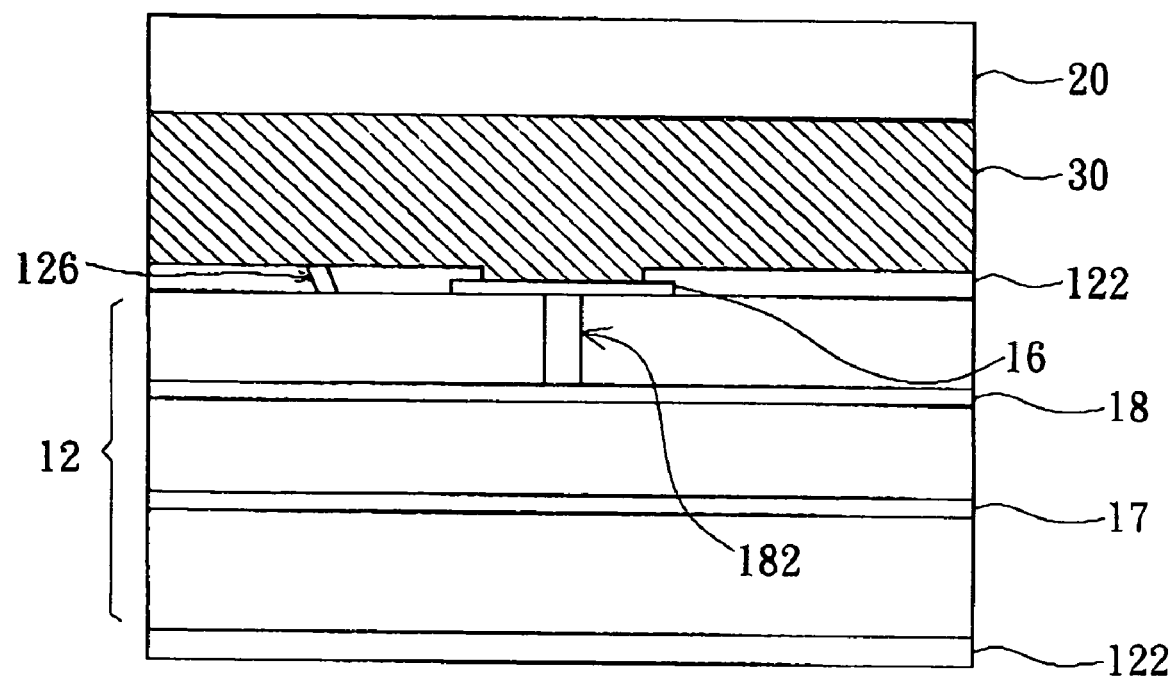
FIG. 3 is a cross-sectional view of the conventional package structure along the section line 3—3 in the neighborhood of the ground pad in FIG. 2.
Figure 4A:
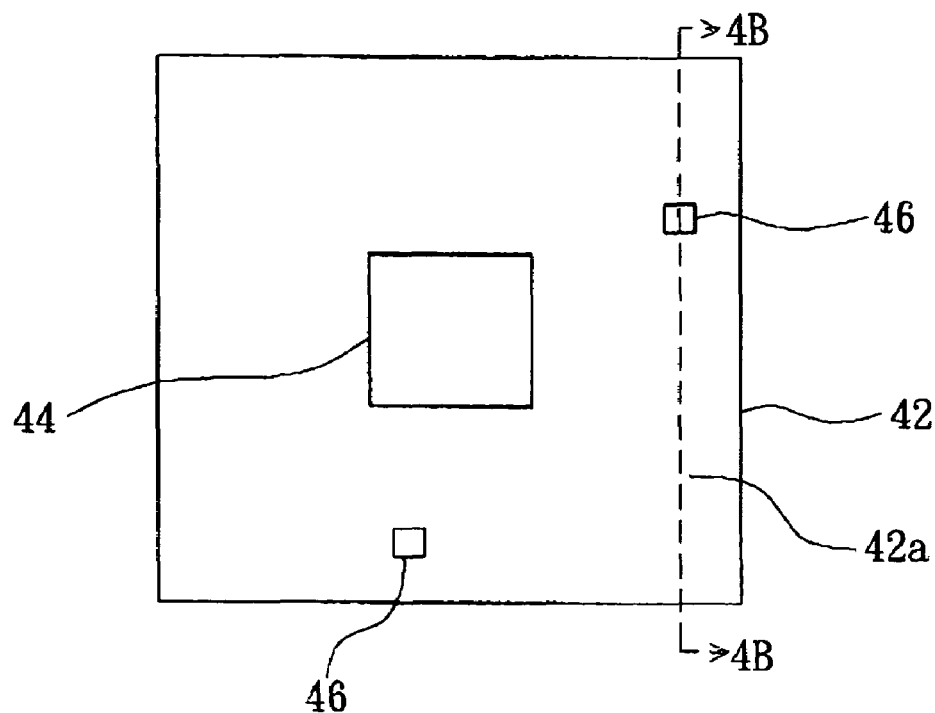
FIGS. 4A, 5A, and 6A are a flowchart of the manufacturing method of the package structure in which the heat spreader is adhered to the substrate according to a first example of the invention.
Figure 4B:
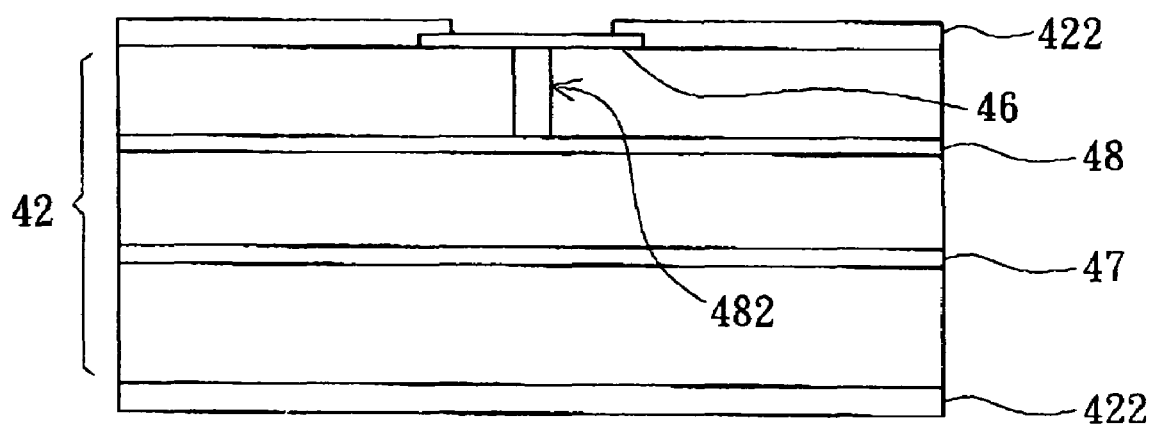
FIG. 4B is the cross-sectional views of the package structures along the corresponding section line 4B—4B in the neighborhood of the ground pad in FIG. 4A.
Figure 5A:
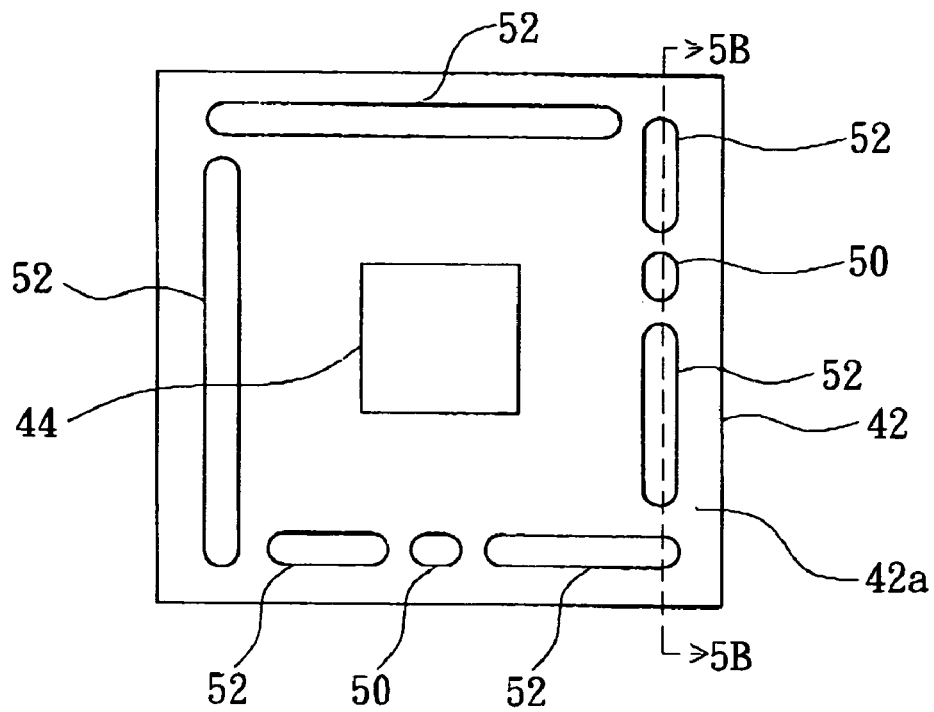
Figure 5B:
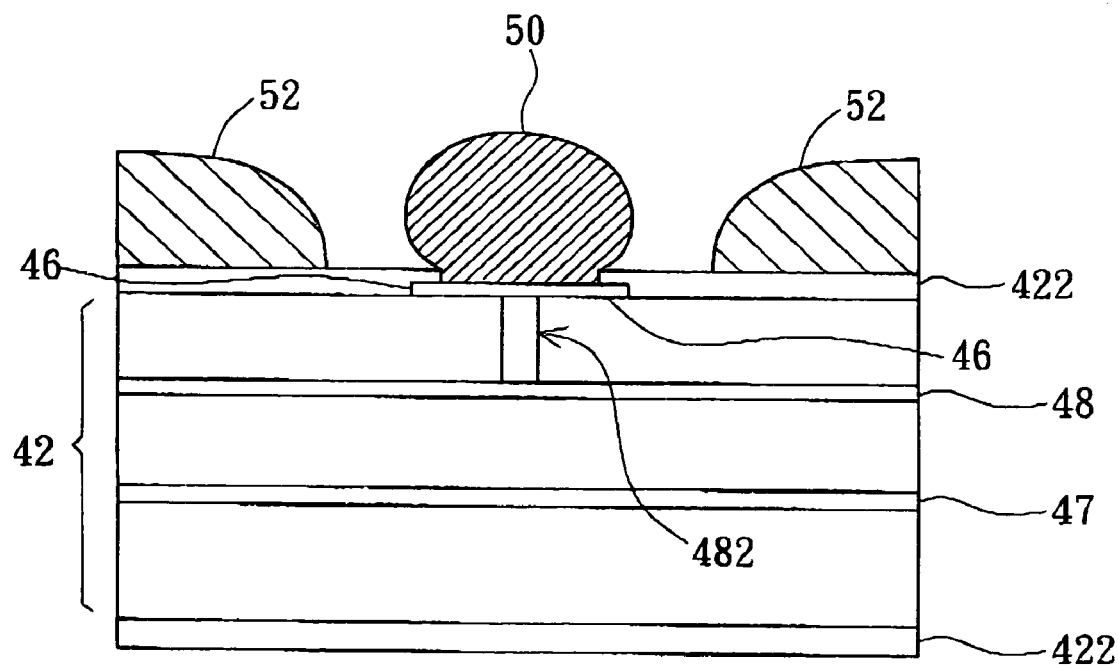
FIG. 5B is the cross-sectional views of the package structures along the corresponding section line 5B—5B in the neighborhood of the ground pad in FIG. 5A.
Figure 6A:
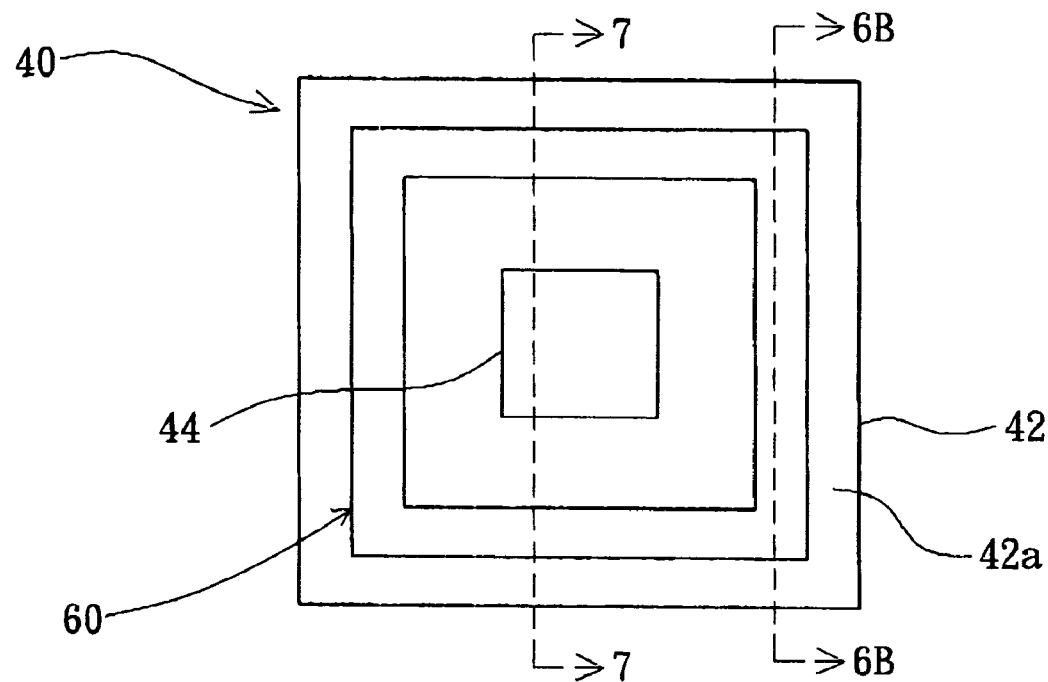
Figure 6B:
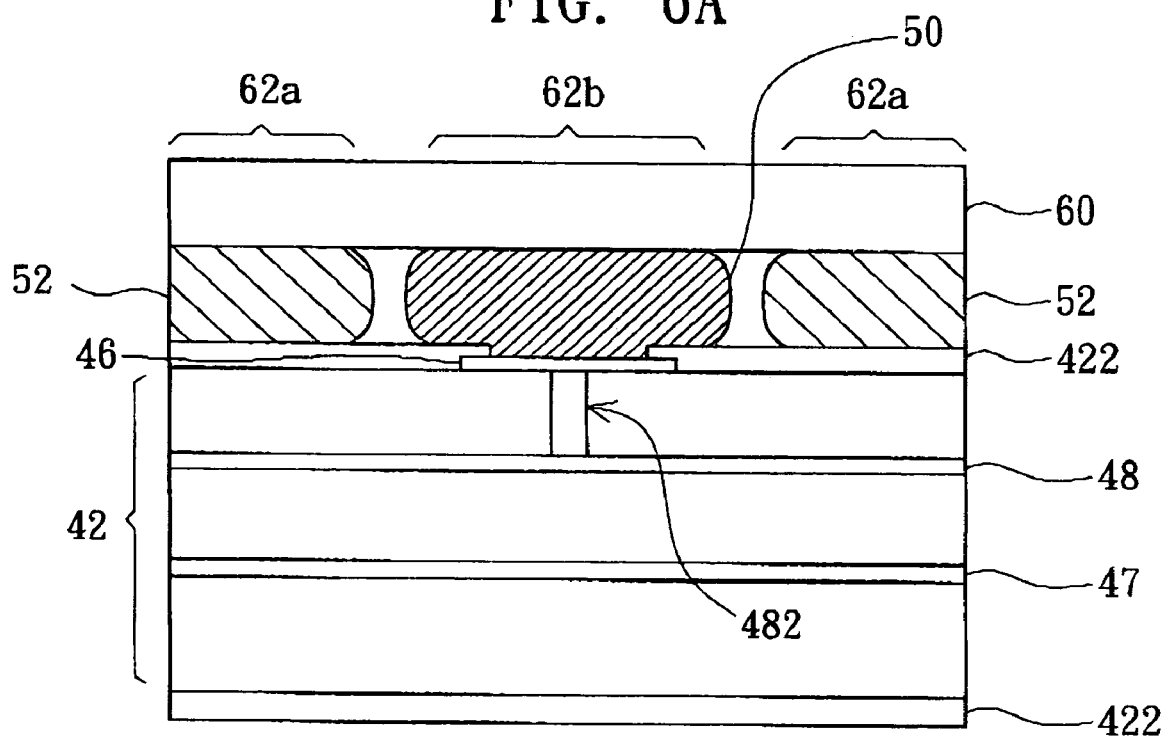
FIG. 6B is the cross-sectional views of the package structures along the corresponding section line 6B—6B in the neighborhood of the ground pad in FIG. 6A.

Referring to FIGS. 4A, 5A, and 6A, a flowchart of the manufacturing method of the package structure in which the heat spreader is adhered to the substrate according to a first example of the invention is shown. FIGS. 4B, 5B, and 6B are respectively the cross-sectional views of the package structures along the corresponding section lines in the neighborhood of the ground pad in FIGS. 4A, 5A, and 6A. In FIG. 4A, a substrate 42 is provided first. At least a ground pad 46 is disposed on the substrate surface 42a, and a die 44 is seated on the substrate 42. As shown in FIG. 4B, the substrate 12 has four layers. The upper and lower surfaces of the substrate 42 are covered by the substrate solder masks 422, excluding the region for disposing the die 44 and the ground pad 46 on the substrate surface 42a. The central layer of the substrate 12 includes a ground layer 48 and a power layer 17. A via 482 is formed in the substrate 42 right under the ground pad 46, and the ground pad 46 can be electrically coupled to the ground layer 48 through the via 482.

Subsequently, the solder paste printing and the adhesive dispensing processes are performed. As shown in FIGS. 5A and 5B, a pre-solder layer 50 is formed on the ground pad 46 by solder paste printing, and a non-conductive adhesive layer 52 is formed on the substrate surface 42a for being adjacent to the pre-solder layer 50 by adhesive dispensing. The non-conductive adhesive layer 52 is formed on the substrate surface 42a, in which no ground pad is disposed, and the non-conductive adhesive layer 52 is made of non-conductive paste. Owing that the ground pad 46 on the substrate surface 42a is not covered by the substrate solder mask 422, the ground pad 46 can touch with the solder paste directly, and in result the pre-solder layer 50 can be formed right on the ground pad 46.

Finally, a heat spreader is respectively electrically coupled to the ground pad 46 and the substrate 42 via the pre-solder layer 50 of solder paste and the non-conductive adhesive layer 52 of non-conductive paste. In FIG. 6B, the heat spreader 60 has a first connecting part 62a and a second connecting part 62b, and is disposed on the substrate 42 via the non-conductive adhesive layer 52 and the pre-solder layer 50. The non-conductive adhesive layer 52 and the pre-solder layer 50 are respectively located under the first connecting part 62a and the second connecting part 62b of the heat spreader 60. The non-conductive adhesive layer 52 is heated for solidification and the pre-solder layer 50 is continuously heated for solder reflow, so that the first connecting part 62a of the heat spreader 60 can be adhered to the substrate 42, and the second connecting part 62b can be electrically coupled to the ground pad 46. The solidification temperature of the non-conductive adhesive layer 52 formed of non-conductive paste is about 175□, so it can be solidified by continuously heating for a period of time. The proportion of tin to lead in the pre-solder layer 50 is preferably 63:37, and the solder reflow temperature of the pre-solder layer 50 is about 183□. As a result, the heat spreader 60 can be electrically coupled to the ground pad 46 via the pre-solder layer 50, and then electrically coupled to the ground layer 48 through the via 482 under the ground pad 46 to connect exterior devices on the substrate 42. Therefore, the heat spreader 60 can have both effects of releasing heat and grounding.

Moreover, for the heat spreader 60 is adhered to the substrate 42 via the non-conductive adhesive layer 50 in the package structure of the invention, even cracks or crevices are formed on the substrate solder mask 422 in the manufacturing process, the circuits on the substrate 42 can be prevented from having a shortcut to the heat spreader 60 due to the insulation of the non-conductive adhesive layer 50.

Figure 7:
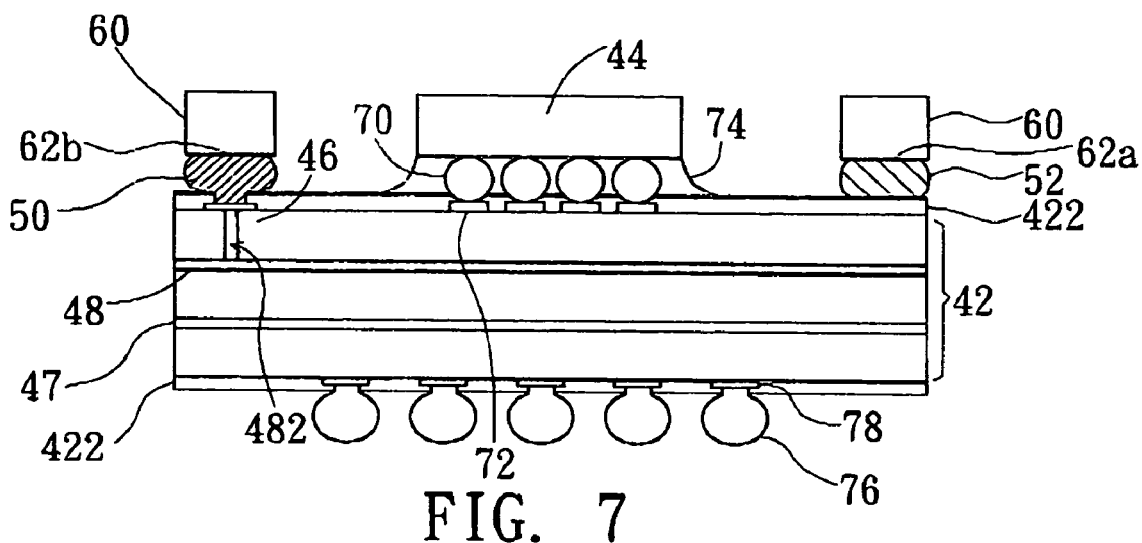
FIG. 7 is a cross-sectional view of the package structure along the section line 7—7 in FIG. 6A according to the first example of the invention.

Referring to FIG. 7, a cross-sectional view of the package structure along the section line 7—7 in FIG. 6A according to the first example of the invention is shown. As illustrated in FIG. 7, a number of solder pads 72 are configured in the region for disposing the die 44 on the substrate 42 almost in a matrix arrangement, so the die 44 can be electrically coupled to the substrate 42 via the solder tin lumps 70 connected to the solder pads 72 in flip chip way. A number of solder pads 78 and the corresponding solder balls 76 are disposed on the lower surface of the substrate 42. In addition, a paste material is filled in the region between the die 44 and the substrate 42 to cover the region under the die 44 and the solder tin lumps 70, so the joint strength of the die 44 and the substrate 42 can be improved. Due to the protection of the paste material, the solder tin lumps 70 are not deformed in the heating and solder reflow process. As shown in FIG. 7, the upper and lower surfaces of the substrate 42 are covered by the substrate solder masks 422, excluding the solder pads 72, 78, and the ground pad 46.

Figure 8:
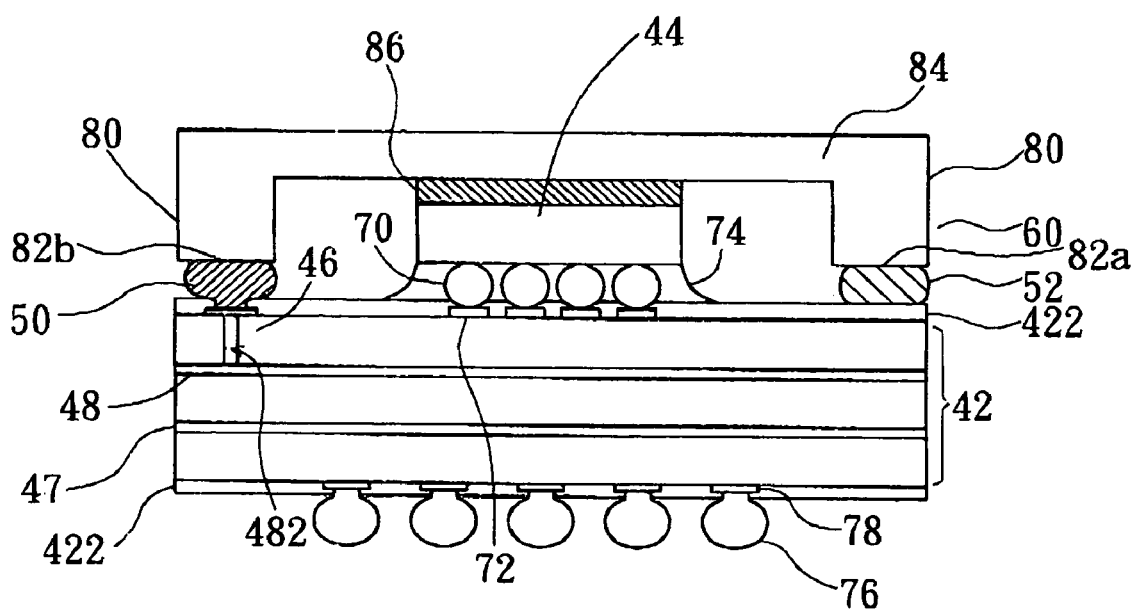
FIG. 8 is a lateral diagram of the package structure with a cap-like heat spreader according to the second example of the invention.

In FIG. 6A, the heat spreader 60 used in the package structure in the first example is a loop-like heat spreader, which surrounds the die 44 on the substrate. By coupling to the part of the substrate surface in the surrounding of the die 44 via the non-conductive adhesive layer 52, the heat spreader 60 can reduce the heat generated from the die 44 and other electronic devices on the substrate 42. Moreover, the package structure of the invention can also have a cap-like heat spreader. Referring to FIG. 8, a lateral diagram of the package structure with a cap-like heat spreader according to the second example of the invention is shown. The cap-like heat spreader includes two holding portions 80 and a flat portion 84, and the holding portion 80 have respectively a first connecting part 82a and a second connecting part 82b. The flat portion 84 covers the die 44, and is adhered to the upper surface of the die 44 via the heat-conductive paste 86, and the holding portions 80 are disposed at two edges of the flat portion 84. The first connecting part 82a is adhered to the substrate 42 via the non-conductive adhesive layer 52 and the second connecting part 82b is connected to the ground pad 46 via the pre-solder layer 50. In addition, the holding portions 80 and the flat portion 84 can be manufactured into a unity, or can be designed as individual elements. In comparison with the loop-like heat spreader, the cap-like heat spreader can release heat generated from the die 44 more effectively, for the flat portion 84 of the cap-like one can cover the die 44 directly.

According to package structure with the heat spreader and method thereof disclosed in the examples mentioned above, the pre-solder layer and the non-conductive adhesive layers are formed respectively on the ground pad and the substrate by the solder paste printing and the adhesive dispensing, so that the heat spreader can be electrically coupled to the ground pad and adhered to the substrate. Not only the circuit shortcut issue caused by using the conductive paste in the prior art can be solved, but the electromagnetic interference shielding effect can also be improved by grounding the heat spreader.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure with a heat spreader, comprising:
   a substrate, having a substrate surface, wherein a die is seated on the substrate;
   a ground pad, disposed on the substrate surface;
   a heat spreader, having a first connecting part and a second connecting part;
   a pre-solder layer, formed on the ground pad, for electrically coupling the second connecting part of the heat spreader to the ground pad; and
   a non-conductive adhesive layer, formed on the substrate surface and adjacent to the pre-solder layer, for adhering the first connecting part of the heat spreader to the substrate surface.

2. The package structure according to claim 1, wherein the substrate surface is further covered by a substrate solder mask.

3. The package structure according to claim 1, wherein the substrate further comprises a ground layer.

4. The package structure according to claim 3, wherein a via is formed in the substrate under the ground pad, and the ground pad can be thus electrically coupled to the ground layer through the via.

5. The package structure according to claim 1, wherein a plurality of solder pads are configured in the region for disposing the die on the substrate surface in a matrix arrangement.

6. The package structure according to claim 5, wherein the package structure further comprises a plurality of solder tin lumps, and the die can be electrically coupled to the substrate via the solder tin lumps in flip chip way.

7. The package structure according to claim 6, wherein the package structure further comprises a paste material for filling in the region between the die and the substrate and covering the region under the die and the solder tin lumps.

8. The package structure according to claim 1, wherein the heat spreader is a loop-like heat spreader.

9. The package structure according to claim 8, wherein the loop-like heat spreader surrounds the die on the substrate.

10. The package structure according to claim 1, wherein the heat spreader is a cap-like heat spreader.

11. The package structure according to claim 10, wherein the cap-like heat spreader comprises:
    a flat portion, covering the die; and
    a holding portion, disposed at an edge of the flat portion and having the first connecting part and the second connecting part.

12. The package structure according to claim 11, wherein the package structure further comprises heat-conductive paste, and the flat portion is adhered to the upper surface of the die via the heat-conductive paste.

13. The package structure according to claim 11, wherein the holding portion and the flat portion are manufactured into a unity.

14. The package structure according to claim 1, wherein the package structure further comprises a plurality of solder balls disposed on the lower surface of the substrate.

* * * * *